US005662143A

United States Patent [19]
Caughran

[11] Patent Number: 5,662,143
[45] Date of Patent: Sep. 2, 1997

[54] MODULAR GAS BOX SYSTEM

[75] Inventor: James W. Caughran, Lodi, Calif.

[73] Assignees: Gasonics International, San Jose, Calif.; MKS Instruments, Inc., Andover, Mass.

[21] Appl. No.: 648,771

[22] Filed: May 16, 1996

[51] Int. Cl.⁶ .................................................. F16K 11/00
[52] U.S. Cl. ........................ 137/884; 137/269; 137/560
[58] Field of Search ................................. 137/269, 271, 137/560, 884

[56] References Cited

U.S. PATENT DOCUMENTS

| | | | |
|---|---|---|---|
| 4,938,258 | 7/1990 | Sato | 137/269 X |
| 5,222,524 | 6/1993 | Sekier et al. | 137/269 X |
| 5,301,717 | 4/1994 | Goedecke | 137/884 |

*Primary Examiner*—Kevin Lee
*Attorney, Agent, or Firm*—Thomas E. Schatzel; Law Offices of Thomas E. Schatzel A Prof. Corporation

[57] ABSTRACT

A modular gas box system comprises a series of modules that each connect into upper and lower manifolds that distribute reactive and purge gases through weldments and monoblock valves. A motherboard distributes power, control signals, and pneumatics air to all the plug-in modules. Environmental modules provide vent and purge lines to the process' reaction chambers. An embedded microcomputer manages in situ system and safety diagnostics for each and every module that has been assigned a motherboard address. Each gas module 24 is easy to remove and replace and the pneumatics control motherboard integrates pneumatics distribution, analog-to-digital converters, device controllers and support electronics. Gas module 24s include digital mass flow controllers, analog and digital pressure switches and transducers, gas filters and pneumatic valves.

9 Claims, 4 Drawing Sheets

MODULAR GAS BOX SYSTEM

BACKGROUND OF THE INVENTION

1. Field of the Invention

The invention relates generally to semiconductor processing equipment and more specifically to mass flow controllers and other devices for the delivery and regulation of hazardous and non-hazardous semiconductor processing gases.

2. Description of the Prior Art

Various recipes are used in the fabrication of semiconductor devices. Such fabrication involves many discrete processing steps where a silicon wafer is cleaned, polished, oxidized, masked, etched, doped, metalized, etc. The steps used, there particular sequence and the materials involved all contribute to the making of particular devices.

Conventional semiconductor fabrication techniques depend on the use of particular process gases, some of which are hazardous. The fabrication of a single chip can require the careful synchronization and measured delivery of as many as a dozen gases to a reaction chamber. Mass flow controllers (MFC's) have long been used to deliver such gases in the required volumes to the point of use.

Conventional semiconductor processing gas systems allow a great deal of component flexibility in the choice of particular MFC's, valves, filters, etc. Weldment and stick manufacturing techniques associated with such prior art systems are well-understood and mastered. But such prior art systems amount to dumb boxes with dumb components that interact only one way with the process controller. Very often signals are sent to a conventional dumb gas box to open a valve and mass flow control the flow. No feedback is provided by the dumb gas box and the first acknowledgment from the system of flow is the all-too-late feedback from the reaction chamber. However, a few mass flow controllers do report back their flow.

Component failures in conventional gas box systems often lead to extensive downtimes. Whole fab lines can be affected with serious impact to production volumes. Switching out failed components can take considerable time because of the complex configurations and difficult access. Keeping a complete inventory of replacement parts on hand to minimize the mean-time-to-repair (MTTR) can be very costly. Worse, component failures are often misdiagnosed, leading to a lot of wasted time and effort. In situ diagnostic tools are generally non-existent.

In general, MFC's have proven to be the least reliable components in a processing gas delivery system. The gas boxes can very often become scapegoats for other equipment and process problems.

SUMMARY OF THE PRESENT INVENTION

It is therefore an object of the present invention to provide a gas box system that provides ease of service.

It is a further object of the present invention to provide a modular gas box system that retains the component flexibility of conventional systems while improving on safety and redundancy.

It is another object of the present invention to provide a modular gas box system with in situ diagnostic capability and that provides information feedback related to included digital components.

Briefly, a modular gas box system embodiment of the present invention comprises a series of modules that each load into a chassis and connect into upper and lower manifolds that distribute reactive and purge gases through weldments and monoblock valves. A motherboard distributes power, control signals, and pneumatics air to all the plug-in modules. Environmental modules provide vent and purge lines to process reaction chambers. An embedded microcomputer manages in situ system and safety diagnostics for each and every module that has been assigned a motherboard address. Each gas module 24 is easy to remove and replace and the pneumatics control motherboard integrates pneumatics distribution, analog-to-digital converters, device controllers and support electronics gas module 24s include digital mass flow controllers, analog and digital pressure switches and transducers, gas filters and pneumatic valves.

An advantage of the present invention is that a modular gas box system is provided that is easy to service.

A further advantage of the present invention is that a modular gas box system is provided that is plug-and-play and yet retains the component flexibility of conventional systems and improves on safety and redundancy.

Another advantage of the present invention is that a modular gas box system is provided with in situ diagnostic capability and information feedback related to included digital components.

These and other objects and advantages of the present invention will no doubt become obvious to those of ordinary skill in the art after having read the following detailed description of the preferred embodiment which is illustrated in the drawing figures.

IN THE DRAWINGS

DETAILED DESCRIPTION OF THE PREFERRED EMBODIMENTS

Figure 1:
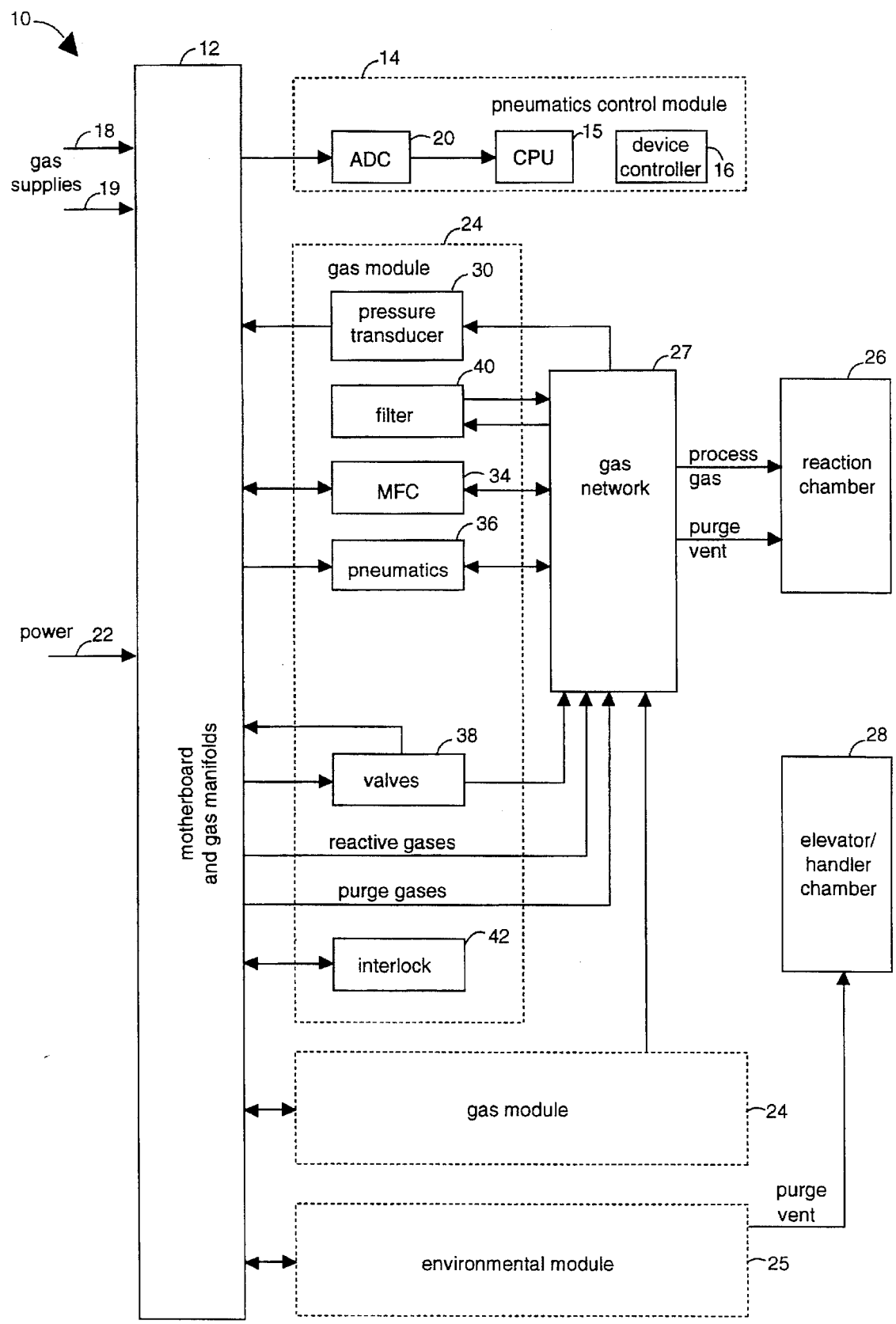
FIG. 1 is a block diagram of a modular gas box system of the present invention.

FIG. 1 illustrates a modular gas box system embodiment of the present invention, referred to by the general reference numeral 10. The modular gas box gas box system 10 comprises a motherboard and gas manifolds assembly 12 and a pneumatic control module 14 with an embedded microcomputer (CPU) 15 and device controller 16 to provide electronic and pneumatic control. The CPU 15 may include an advanced 32-bit device, such as the PENTIUM™ as marketed by Intel Corporation (Santa Clara, Calif.). A pair of gas supplies 18 and 19 represent several different process gas inputs which may be any of a number of process gas supply inputs from bulk storage facilities. An analog-to-digital converter (ADC) 20 converts analog pressure readings to digital signals for the CPU 15.

A power connection 22 provides for the input of system power that is distributed to a plurality of plug-in gas modules 24 and environmental modules 25. Each gas module provides for the individual control of a particular process gas that is combined with other controlled process gases before being forwarded to a reaction chamber 26 through a gas network 27. Each environmental module 25 is connected to a wafer cassette elevator or handling chamber 28 that is antechamber to the reaction chamber 26, and provides for purging with nitrogen ($N_2$) and venting.

A pressure transducer 30 supplies an analog signal representing the gas pressures in the system, e.g., in the gas network 27 and in the reaction chamber 26, to the ADC 20. A digitally. controlled mass flow controller (MFC) 34 is connected to the gas network 27 and ultimately the gas manifold assembly 12. The MFC 34 may be a conventional unit, e.g., a MKS-1179B elastomer or MK-1679B all-metal unit, as marketed by Gasonics International (San Jose, Calif.). A pneumatics sub-system 36 provides mechanical control of a set of valves 38 and the gas network 27 by air-pressure control through tubes. The valves 38 may be in the form of a bellows valve with a switch. A filter 40 helps maintain the purity and cleanliness of the process gases fed to the process chamber 26 from the bulk supply inputs 18 and 19. Alternatively, an interlock 42 may be included to signal the pneumatic control module 14 to prevent any gas flow if a gas or environmental module 24 or 25 is missing or not completely installed. This will assure that the appropriate purges of the system are complete before allowing service access.

A convenient size for each plug-in environmental module 25 is approximately eight and a half inches in height by fifteen inches in width by two and a half inches in depth. A whole gas box system 10 with ten gas modules 24 and two environmental modules 25 preferably fits in a thirty-six inch chassis rack that is eighteen and a half inches in height and eighteen and a half inches deep.

The modular gas box gas box system 10 allows a variety of modules 24 to be accommodated. Each module has standard fittings that connect into upper and lower gas manifolds that distribute reactive and purge gases through weldments and monoblock valves. The motherboard and gas manifold assembly 12 connects to each environmental module 25, e.g., with a connector, and distributes power, control signals, and pneumatics air to all of the plug-in modules 24. Environmental modules provide vent and purge lines to each process reaction chamber 26. The embedded microcomputer 14 manages the in situ system and safety diagnostics for each module according to a motherboard address that corresponds to the station in the rack. Each gas module 24 is easy to remove and replace and the pneumatics control motherboard integrates pneumatics distribution, analog-to-digital converters, device controllers and support electronics. Each gas module 24 and environmental module 25 can include various configurations of digital mass flow controllers, analog and digital pressure switches and transducers, gas filters and pneumatic valves.

Pressure transducers 30 are a part of each gas module 24 and are, in general, preferred over pressure switches. The upstream gas pressure can be monitored more efficiently by the pneumatic control module 14 when using a pressure transducer. This provides superior performance over systems that rely only on a simple pressure switch, or no sensor at all. Real-time gas pressure information is thus provided to the pneumatic control module 14. The pressure transducer 30 drives the MFC 34 recalibration and enables superior flow control. The pneumatic control module 14 is preferably configured to warn a user of inadequate upstream pressure and to compensate for minor supply pressure changes. Long term changes in the condition of the gas filter 40 can also be detected by the pressure transducer 30 and pneumatic control module 14. For example, the slow soiling of the filter material to the point it is in need of replacement can be tracked and a maintenance action item announced to a user.

Figure 2:
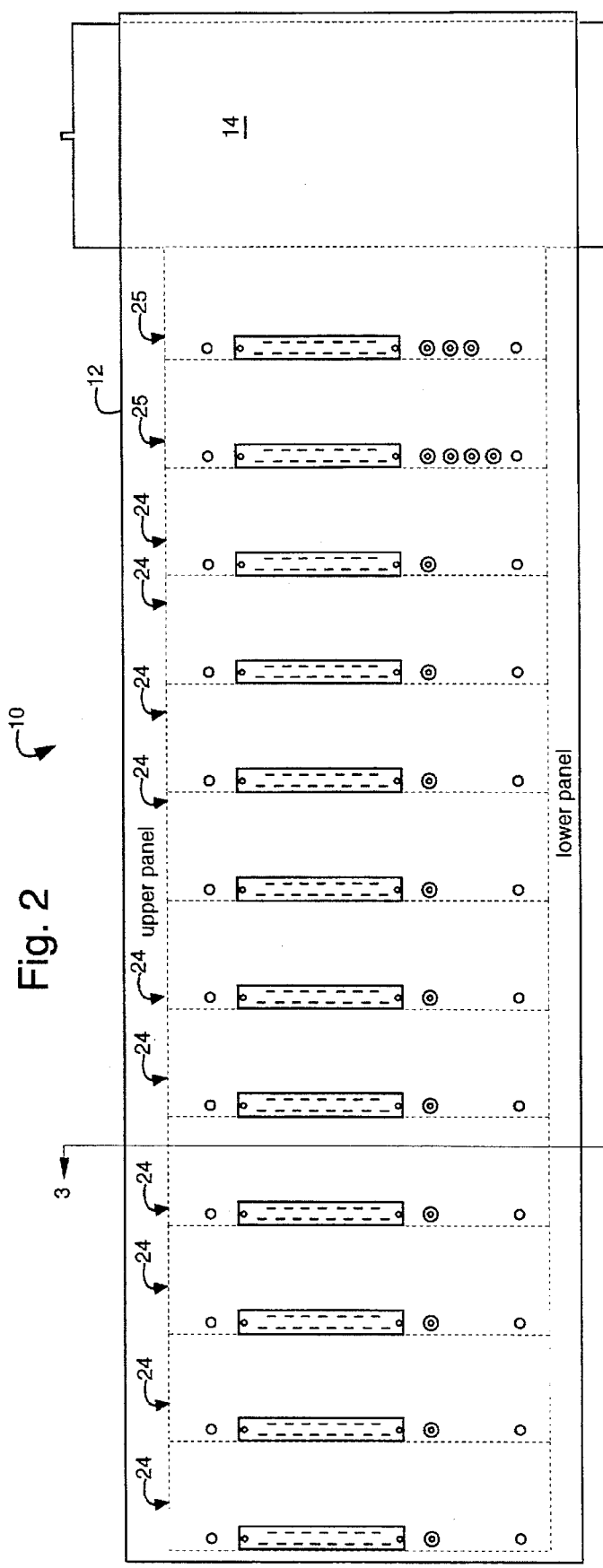
FIG. 2 is a position plot of the front side of the modular gas box system of FIG. 1 showing ten gas modules and two environmental modules installed on the motherboard and gas manifolds.

FIG. 2 shows a full rack of ten gas modules 24 and two environmental modules 25 installed in the gas box system 10 various weldments are provided top and bottom above and below the modules 24 and 25 to implement the manifold part of assembly 12 and the gas network 27. Each of the ten gas modules 24 and two environmental modules 25 are rectangular shaped cubes with a back end that mates to electrical connections in the motherboard part of the assembly 12, a front end that faces a user from the rack, a top side that outputs the controlled gases, and a bottom side that inputs the controlled gases. The top and bottom outputs and inputs are preferably located near the front end to make removal and replacement as convenient as possible.

Figure 3:
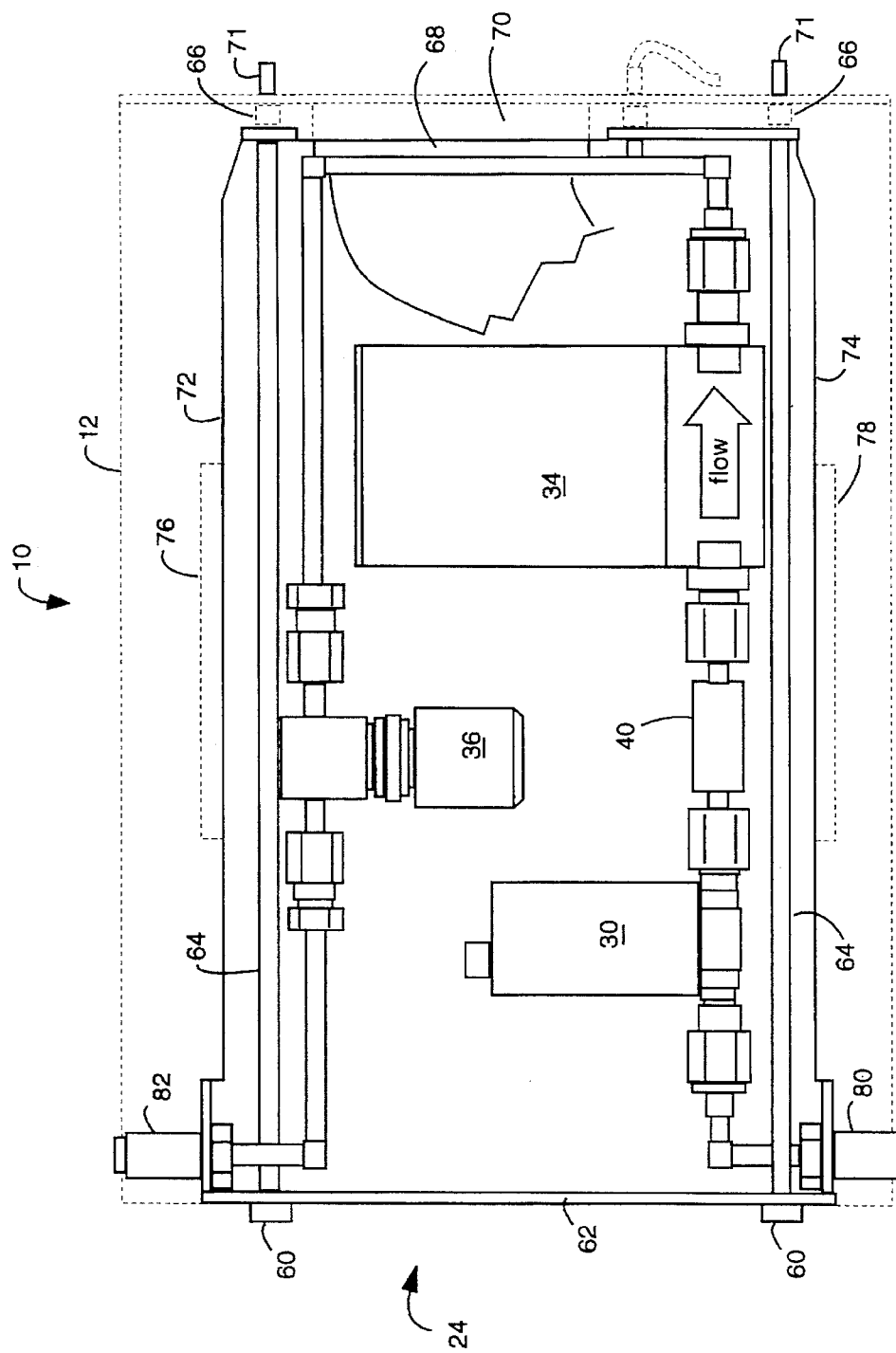
FIG. 3 is a cross-sectional diagram of the modular gas box system of FIG. 2 taken along the line 3—3 and showing a single gas module in plan view.

FIG. 3 illustrates a typical gas module 24 plugged into the motherboard and gas manifold assembly 12. A pair of knurled knobs 60 appear in front of a face plate 62 and are used to turn a pair of screw shafts 64 that mechanically secure the gas module 24 to the motherboard and gas manifold assembly 12 with a pair of nuts 66. An electrical plug 68 at the outside rear of the gas module 24 engages a mating receptacle 70 at the inside rear of the motherboard and gas manifold assembly 12 when the module is fully inserted and secured with the screws 71. A pair of top and bottom card edges 72 and 74 track inside a corresponding pair of top and bottom slot guides 76 and 78 to align the gas module 24 within the motherboard and gas manifold assembly 12. A gas input fitting 80 and a gas output fitting 82 are conveniently located at the front to allow quick disconnect and change-outs of the gas module 24. The gas input fitting 80 typically connects to a gas supply manifold, and the gas output fitting 82 typically connects to the reaction chamber 26 through the gas network 27. Any of a number of internal gas control configurations can be accommodated in between the input fitting 80 and the output fitting 82. For example, the pressure transducer 30 is shown connected to and upstream of the gas filter 40 and mass flow controller 34. The pneumatically controlled valve 36 turns the gas flow on and off automatically to the output fitting 82.

The critical features of the gas module 24 include the standardized dimensions of the module itself, the placement of screws 71 to engage nuts 66, the position and size of the gas fittings 80 and 82, the pinout and placement of the connector plug and receptacle 68 and 70, etc. Preferably, the gas modules 24 are mechanically and electrically interchangeable with similar and varied gas control configurations.

Figure 4:
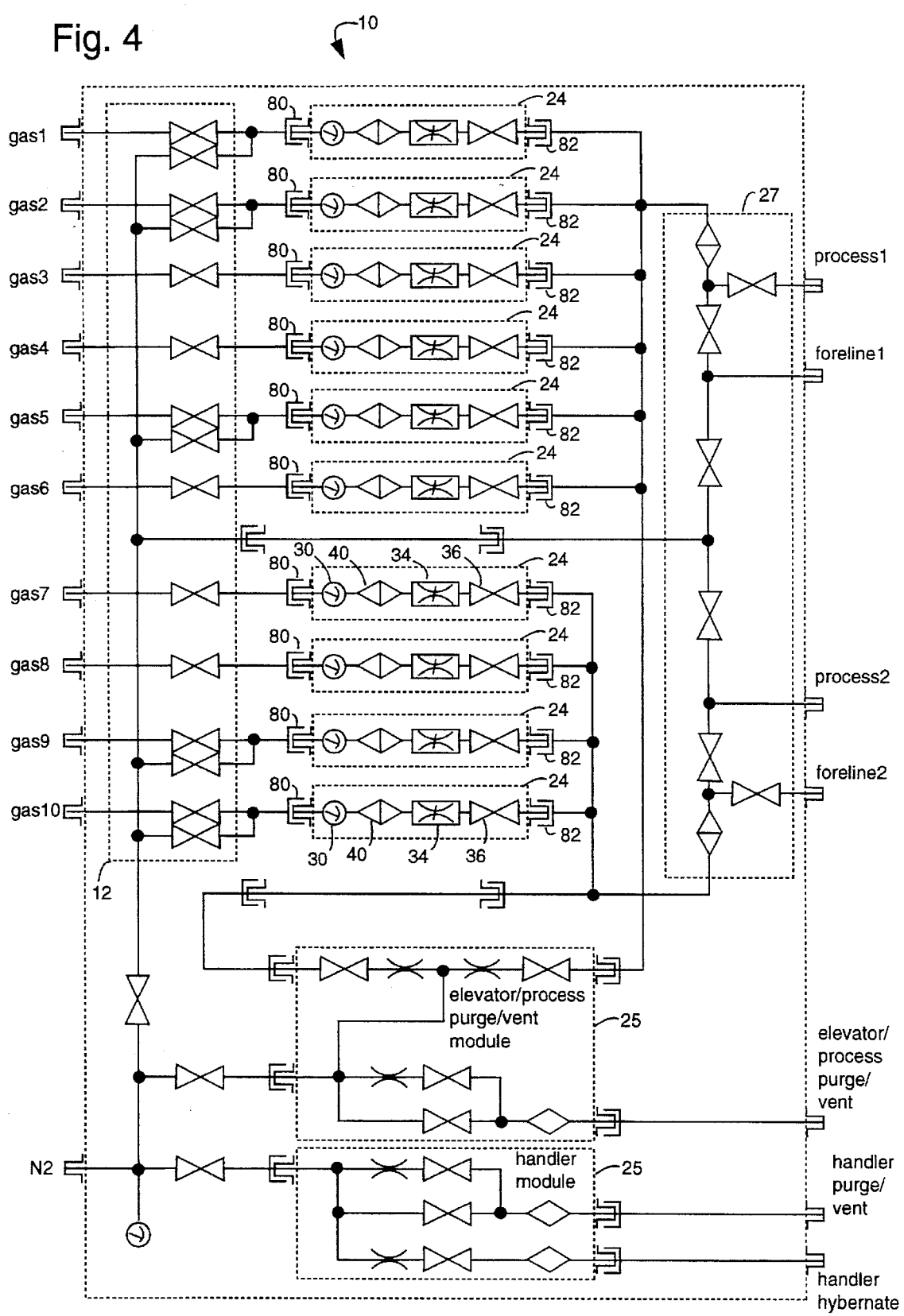
FIG. 4 is a schematic diagram of a particular application configuration of the gas box system of FIG. 1.

FIG. 4 is a schematic diagram of an exemplary gas piping configuration used to implement a particular embodiment of the system 10. The ten gas modules 24 each receive a corresponding process or reactive gas (gas1-gas10) through a valve in the manifold 12 and then on to respective fittings 80. The outputs from fittings 82 are collected into two branches by gas network 27 that may be combined or separated, e.g., for two reaction chambers 26. A nitrogen ($N_2$) purge gas input is valved to selected gas modules 24 and to the two environmental modules 25.

Although the present invention has been described in terms of the presently preferred embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A modular gas box system for the control of process and purge gases to a semiconductor process reaction chamber, comprising:
   a rack with an electrical motherboard and a reactive and purge gas manifold having a plurality of addressable docking stations;
   a plurality of gas modules each configured to be interchangeable with any of said addressable docking stations and each having a gas input fitting and a gas output fitting at standardized locations at the bottom and top of the gas module near a front end; and
   a gas network providing for the connection to each of said gas output fittings and having a plurality of valves to direct a combination of process and purge gases to a semiconductor process reaction chamber.

2. The system of claim 1, wherein:
   the rack includes a manifold with a plurality of pneumatically controlled valves that admits as many individual reactive gases as there are said plurality of addressable docking stations and a purge gas.

3. The system of claim 1, wherein:
   each of the plurality of gas modules includes a series connection between said gas input fitting and gas output fitting of a pressure transducer, a gas filter, a mass flow controller, and a pneumatically controlled valve, wherein the pressure transducer, the mass flow controller, and the pneumatically controlled valve are each connected to a microcomputer through said electrical motherboard for automatic gas control and monitoring.

4. The system of claim 1, wherein:
   the rack includes a gas network with a plurality of pneumatically controlled valves that admits a combination of said reactive gases and said purge gas from the plurality of gas modules.

5. The system of claim 1, further comprising:
   a plurality of environmental modules each configured to be interchangeable with any of said addressable docking stations and each having at least one purge gas input fitting and at least one purge gas output fitting at standardized locations at the bottom and top of the environmental module near a front end.

6. A modular gas box system for the control of process and purge gases to a semiconductor process reaction chamber, comprising:
   a rack with an electrical motherboard and a reactive and purge gas manifold having a plurality of addressable docking stations;
   a plurality of environmental modules each configured to be interchangeable with any of said addressable docking stations and each having at least one purge gas input fitting and at least one purge gas output fitting at standardized locations at the bottom and top of the environmental module near a front end;
   a plurality of gas modules each configured to be interchangeable with any of said addressable docking stations and each having a gas input fitting and a gas output fitting at standardized locations at the bottom and top of the gas module near a front end; and
   a gas network providing for the connection to each of said gas output fittings and having a plurality of valves to direct a combination of process and purge gases to a semiconductor process reaction chamber;
   wherein, the rack includes a manifold with a plurality of pneumatically controlled valves that admits as many individual reactive gases as there are said plurality of addressable docking stations and a purge gas;
   wherein, each of the plurality of gas modules includes a series connection between said gas input fitting and gas output fitting of a pressure transducer, a gas filter, a mass flow controller, and a pneumatically controlled valve, wherein the pressure transducer, the mass flow controller, and the pneumatically controlled valve are each connected to a microcomputer through said electrical motherboard for automatic gas control and monitoring; and
   wherein, the rack includes a gas network with a plurality of pneumatically controlled valves that admits a combination of said reactive gases and said purge gas from the plurality of gas modules.

7. A gas module for the individual control of a semiconductor process reactive gas, comprising:
   a front panel that provides access to fastener means for mechanically securing the gas module to a rack with an electrical motherboard and a reactive and purge gas manifold having a plurality of addressable docking stations;
   a top side having a gas output fitting in a standardized location that provides for module interchangeability and having a slide edge that provides for guiding the gas module into and out of said rack;
   a bottom side having a gas input fitting in a standardized location that provides for module interchangeability and having a slide edge that provides for guiding the gas module into and out of said rack; and
   a back end with an electrical connector in a standardized location that provides for module interchangeability.

8. The gas module of claim 7, further comprising:
   a series connection between said gas input fitting and gas output fitting of a pressure transducer, a gas filter, a mass flow controller, and a pneumatically controlled valve, wherein the pressure transducer, the mass flow controller, and the pneumatically controlled valve are each connected to a microcomputer through said electrical motherboard for automatic gas control and monitoring.

9. A environmental module for the individual control of purge gases in a cassette elevator or handling chamber in semiconductor process, comprising:
   a front panel that provides access to fastener means for mechanically securing the environmental module to a rack with an electrical motherboard and a reactive and purge gas manifold having a plurality of addressable docking stations;
   a top side having at least one gas output fitting in a standardized location that provides for module interchangeability and having a slide edge that provides for guiding the environmental module into and out of said rack;
   a bottom side having at least one gas input fitting in a standardized location that provides for module interchangeability and having a slide edge that provides for guiding the environmental module into and out of said rack; and
   a back end with an electrical connector in a standardized location that provides for module interchangeability.

* * * * *